(12) United States Patent
Hsieh

(10) Patent No.: US 10,924,088 B1
(45) Date of Patent: Feb. 16, 2021

(54) OPTICAL PULSE TO VOLTAGE SIGNAL CONVERTER

(71) Applicant: Rockwell Collins, Inc., Cedar Rapids, IA (US)

(72) Inventor: Han Chi Hsieh, Gaithersburg, MD (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 149 days.

(21) Appl. No.: 16/275,042

(22) Filed: Feb. 13, 2019

(51) Int. Cl.
*H03K 3/017* (2006.01)
*H03F 3/08* (2006.01)
*G01J 1/46* (2006.01)
*G01J 1/44* (2006.01)

(52) U.S. Cl.
CPC ............... *H03K 3/017* (2013.01); *G01J 1/46* (2013.01); *H03F 3/08* (2013.01); *G01J 2001/446* (2013.01); *G01J 2001/4413* (2013.01)

(58) Field of Classification Search
CPC .... H03K 3/017; H03F 3/08; G01J 1/46; G01J 2001/446; G01J 2001/4413
See application file for complete search history.

(56) References Cited

U.S. PATENT DOCUMENTS

2014/0192360 A1* 7/2014 Atzler .................. G01J 1/46
356/432
2018/0180470 A1* 6/2018 Seitz .................. G01S 7/4868

* cited by examiner

*Primary Examiner* — Tony Ko
(74) *Attorney, Agent, or Firm* — Suiter Swantz pc llo

(57) ABSTRACT

An optical pulse to voltage signal converter may include a photodetector, a front end-circuit, and a signal processor. The front-end circuit may include a tunable loading network configured to convert a stream of current pulses from the photodetector into a stream of input voltage signals, at least one tunable voltage source configured to generate at least one stream of signals with at least one select voltage, and at least one amplifier coupled to the at least one tunable voltage source. The at least one amplifier may be configured to compare the stream of input voltage signals and the at least one stream of signals with the at least one select voltage to generate at least one stream of output voltage signals with a select duty-cycle phase and duty-cycle resolution. The amplifier may be further configured to output the at least one stream of output voltage signals to the signal processor.

20 Claims, 3 Drawing Sheets

OPTICAL PULSE TO VOLTAGE SIGNAL CONVERTER

GOVERNMENT LICENSE RIGHTS

This invention was made with government support under NRO000-14-C-0206 awarded by the National Reconnaissance Office, an agency in the Department of Defense. The government has certain rights in the invention.

BACKGROUND OF THE INVENTION

In optoelectronics, photo-detected optical energy is converted from an electrical current to a voltage signal through conversion circuits such as transimpedance amplifiers (TIAs). Many optoelectronic systems utilize pulsed optical signals for applications including fiber optical communications, free space optical communications, radio frequency (RF) analog links, remote sensing, material science, or the like.

Pulsed optoelectronic systems generally make use of optical sources that produce periodic optical pulses. When a stream of periodic optical pulses is incident on a photodetector, a corresponding stream of current pulses is generated by the photodetector. The amplitude and width of the current pulses are generally proportional to the pulse energy and width, respectively. The stream of current pulses is converted to a stream of voltage signals before applying signal processing, display, digitization, or recording operations. One such common operation is digitization of the amplitude of the voltage signal. For low duty-cycle pulse streams with narrow pulses compared to the pulse repetition rate, fast low noise electronic circuits are required to accurately digitize the pulse width. The design of such circuits may depend on the particular pulse width and repetition rate (duty-cycle) required for the application at hand.

Therefore, it would be advantageous to provide a system and method that cures the shortcomings described above.

SUMMARY

In one aspect, embodiments of the inventive concepts disclosed herein are directed to an optical pulse to voltage signal converter. The converter may include a photodetector configured to generate a stream of current pulses by converting a stream of optical pulses received from a pulsed optical source. The optical pulse to voltage signal converter may include a front-end circuit. The front-end circuit may include a tunable loading network configured to convert a stream of current pulses into a stream of input voltage signals. The front-end circuit may include at least one tunable voltage source configured to generate at least one stream of signals with at least one select voltage. The front-end circuit may include at least one amplifier coupled to the at least one tunable voltage source. The at least one amplifier may be configured to compare the stream of input voltage signals and the at least one stream of signals with the at least one select voltage to generate at least one stream of output voltage signals with a select duty-cycle phase and a select duty-cycle resolution. The select duty-cycle phase may be dependent on a set of operational parameters of the tunable loading network and the at least one tunable voltage source. The select duty-cycle resolution may be dependent on a number of steps within at least one conversion stage defined by the at least one tunable voltage source. The optical pulse to voltage signal converter may include a signal processor. The amplifier may be further configured to output the at least one stream of output voltage signals to the signal processor.

In a further aspect, embodiments of the inventive concepts disclosed herein are directed to a front-end circuit for an optical pulse to voltage signal converter. The front-end circuit may include a tunable loading network configured to convert a stream of current pulses into a stream of input voltage signals. The front-end circuit may include a tunable voltage source configured to generate a stream of signals with a select voltage. The front-end circuit may include an amplifier coupled to the tunable voltage source. The amplifier may be configured to compare the stream of input voltage signals and the stream of signals with the select voltage to generate a stream of output voltage signals with a select duty-cycle phase and a select duty-cycle resolution. The select duty-cycle phase may be dependent on a set of operational parameters of the tunable loading network and the tunable voltage source. The select duty-cycle resolution may be dependent on a number of steps within a conversion stage defined by the tunable voltage source.

In a further aspect, embodiments of the inventive concepts disclosed herein are directed to a front-end circuit for an optical pulse to voltage signal converter. The front-end circuit may include a tunable loading network configured to convert a stream of current pulses into a stream of input voltage signals. The front-end circuit may include a first tunable voltage source configured to generate a first stream of signals with a first select voltage. The front-end circuit may include a first amplifier coupled to the first tunable voltage source. The first amplifier may be configured to compare the stream of input voltage signals and the first stream of signals with the first select voltage to generate a first stream of output voltage signals. The front-end circuit may include a second tunable voltage source configured to generate a second stream of signals with a second select voltage. The front-end circuit may include a second amplifier coupled to the second tunable voltage source. The second amplifier may be configured to compare the first stream of output voltage signals and the second stream of signals with the second select voltage to generate a second stream of output voltage signals with a select duty-cycle phase and a select duty-cycle resolution. The select duty-cycle phase may be dependent on a set of operational parameters of the tunable loading network, the first tunable voltage source, and the second tunable voltage source. The select duty-cycle resolution may be dependent on a first set of steps within a first conversion stage defined by the first tunable voltage source and a second set of steps within a second conversion stage defined by the second tunable voltage source.

It is to be understood that both the foregoing general description and the following detailed description are exemplary and explanatory only and are not necessarily restrictive of the present disclosure. The accompanying drawings, which are incorporated in and constitute a part of the characteristic, illustrate subject matter of the disclosure. Together, the descriptions and the drawings serve to explain the principles of the disclosure.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF EXEMPLARY EMBODIMENTS

Figure 1:
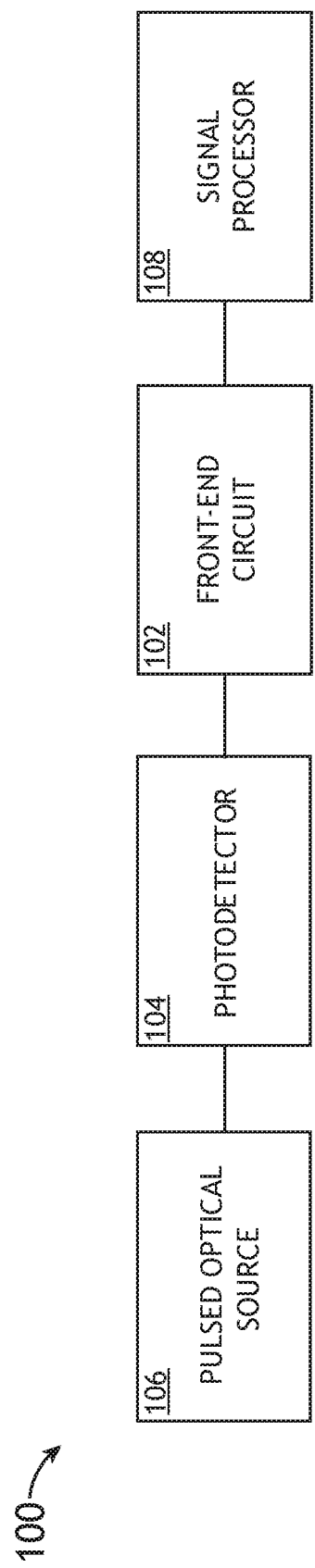
FIG. 1 is an exemplary embodiment of a block diagram illustrating an optical pulse to voltage signal converter, according to the inventive concepts disclosed herein.

Reference will now be made in detail to the subject matter disclosed, which is illustrated in the accompanying drawings.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the inventive concepts disclosed herein in any way unless expressly stated to the contrary.

In addition, use of the "a" or "an" are employed to describe elements and components of embodiments of the instant inventive concepts. This is done merely for convenience and to give a general sense of the inventive concepts, and "a' and "an" are intended to include one or at least one and the singular also includes the plural unless it is obvious that it is meant otherwise.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Further, any arrangement of components to achieve a same functionality is effectively "associated" such that the desired functionality is achieved, such that any two components herein combined to achieve a particular functionality can be seen as "associated with" each other (irrespective of architectures or intermedial components). Any two components so associated can also be viewed as being "operably connected" or "operably coupled" to each other to achieve the desired functionality, and any two components capable of being so associated can also be viewed as being "operably couplable" to each other to achieve the desired functionality. Examples of operably couplable include, but are not limited to, physically mateable and/or physically interacting components, wirelessly interactable and/or wirelessly interacting components, logically interacting and/or logically interactable components, or the like.

Further, one or more components may be referred to herein as "configured to," "configurable to," "operable/ operative to," "adapted/adaptable," "able to," "conformable/ conformed to," etc. Those skilled in the art will recognize that such terms (e.g., "configured to") can generally encompass active-state components and/or inactive-state components and/or standby-state components, unless context requires otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of or sub-combination of two or more such features, along with any other features which may not necessarily be expressly described or inherently present in the instant disclosure.

Figure 2A:
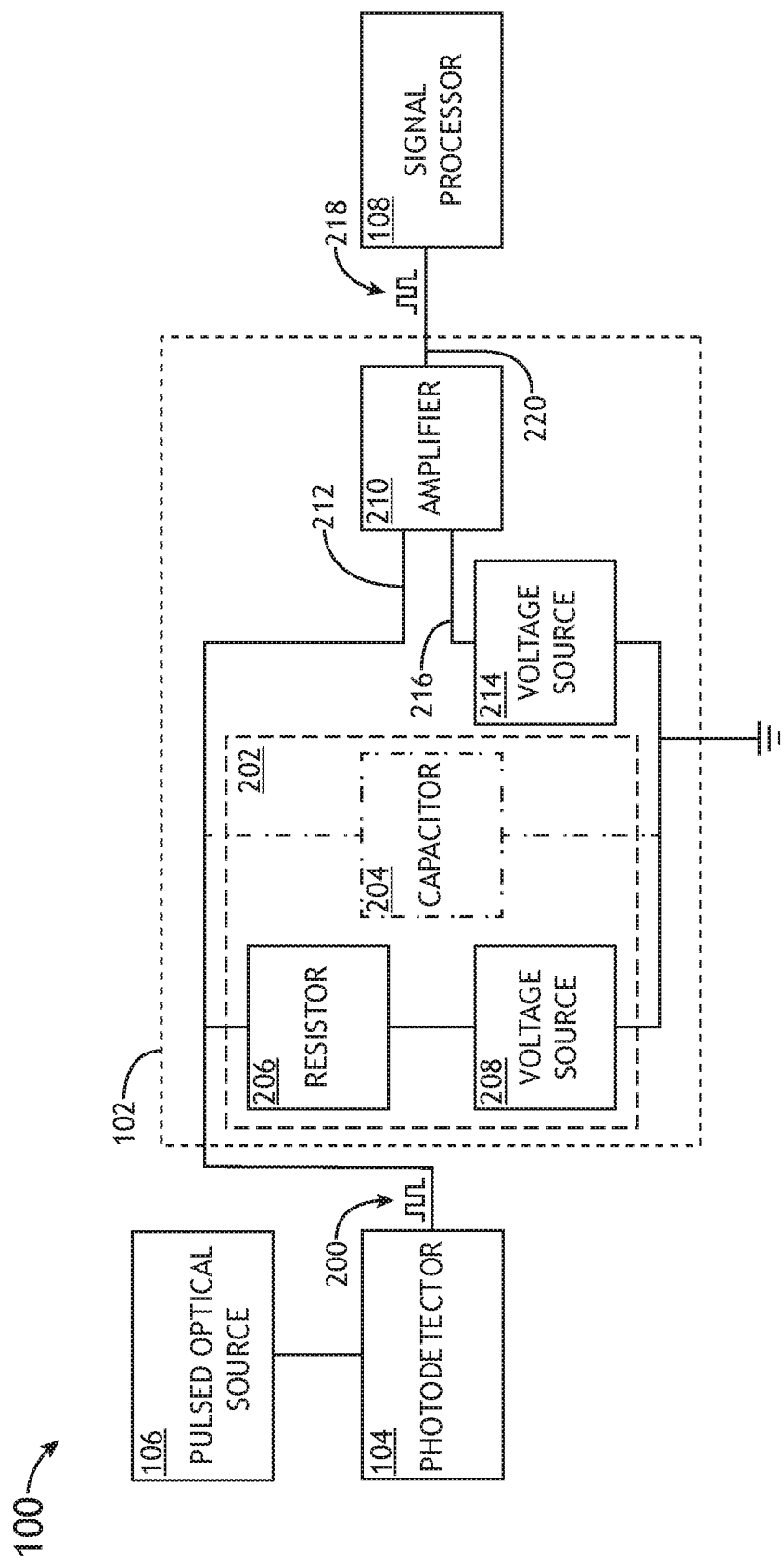
FIG. 2A is an exemplary embodiment of a block diagram illustrating an optical pulse to voltage signal converter, according to the inventive concepts disclosed herein.
Figure 2B:
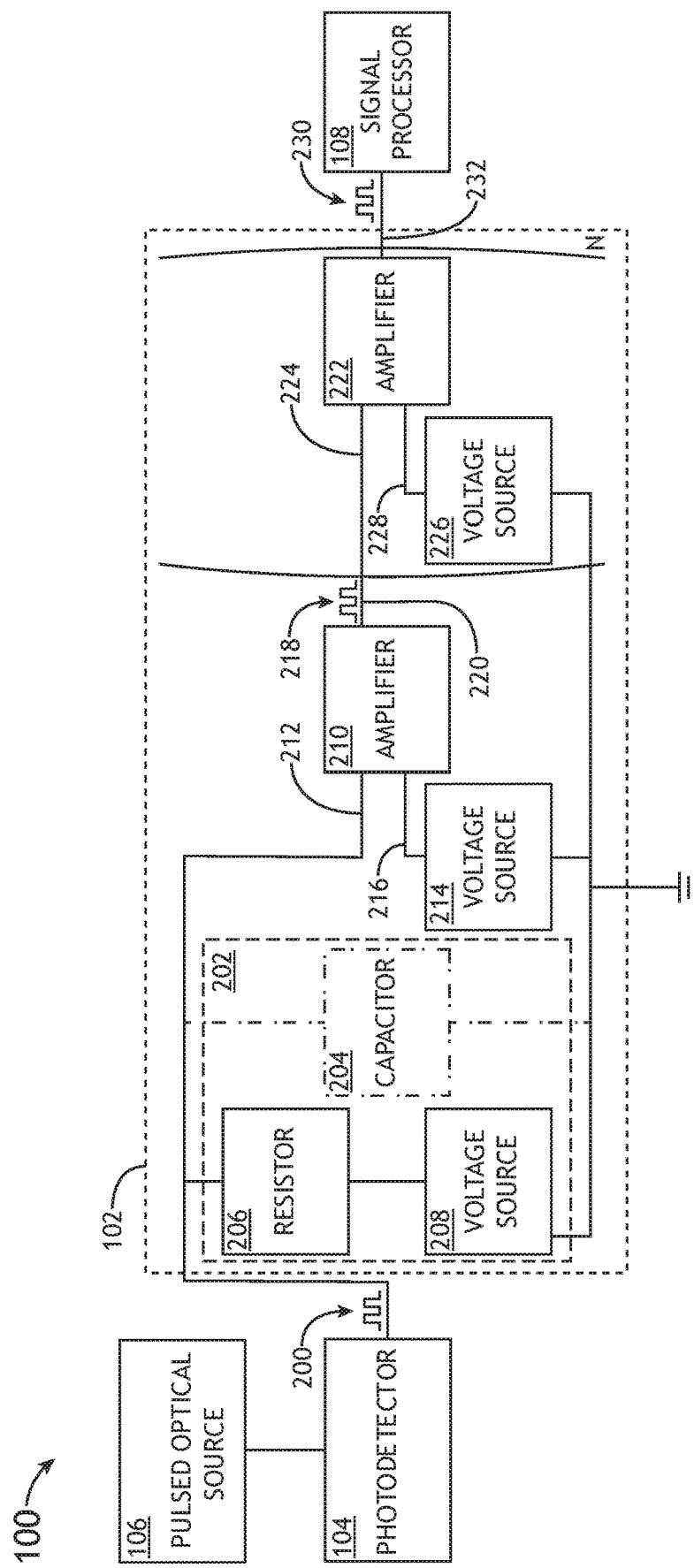
FIG. 2B is an exemplary embodiment of a block diagram illustrating an optical pulse to voltage signal converter, according to the inventive concepts disclosed herein.

FIGS. 1-2B generally illustrate exemplary embodiments of an optical pulse to voltage signal converter, in accordance with the inventive concepts disclosed herein.

Broadly, embodiments of the inventive concepts disclosed herein are directed to an optical pulse to voltage signal converter. More particularly, embodiments of the inventive concepts disclosed herein are directed to an optical pulse to voltage signal converter with a wide operating range of input pulse repetition rate and a wide duty-cycle tuning range, with the capability to achieve a select duty-cycle resolution.

FIGS. 1-2B illustrate exemplary embodiments of an optical pulse to voltage signal converter 100, in accordance with the inventive concepts disclosed herein.

Referring now to FIG. 1, the converter 100 may include a front-end circuit 102. The front-end circuit 102 may be configured to convert a stream of voltage signals across a wide operating range of input pulse repetition rate (e.g., a wide frequency range for duty-cycle tuning) without requiring a change in hardware.

The converter 100 may include a photodetector 104 coupled to and/or in communication with the front-end circuit 102. For example, the photodetector 104 may include, but is not limited to, a photodiode, a photo transistor, or the like. The photodetector 104 may receive one or more optical pulses from a pulsed optical source 106. For example, the pulsed optical source 106 may output incident light as one or more optical pulses.

Referring now to FIGS. 2A and 2B, the photodetector 104 may generate a stream of current pulses 200 based on the one or more optical pulses. The converter 100 may include a voltage source coupled to and/or in communication with the photodetector 104. For example, the voltage source may be a fixed voltage source. By way of another example, the voltage source may be a tunable voltage source. The voltage source may share a common ground with the front-end circuit 102 and/or a signal processor 108 in communication with the front-end circuit 102. It is noted herein, however, that one or more components of the converter 100 may have a separate or standalone ground. Therefore, the above description should not be interpreted as a limitation on the present disclosure but merely an illustration.

The front-end circuit 102 may receive and process the stream of current pulses 200 generated by the photodetector 104. For example, the front-end circuit 102 may convert the stream of current pulses 200 generated by the photodetector 104 into a stream of voltage signals with a select duty-cycle.

The front-end circuit 102 may include a tunable loading network 202. The tunable loading network 202 may include one or more tunable electrical components configured to convert the stream of current pulses 200 into the stream of voltage signals. For example, the tunable loading network 202 may include one or more tunable capacitors. For instance, the photodetector 104 may be coupled to and/or in communication with a tunable capacitor 204. By way of another example, the tunable loading network 202 may include one or more tunable resistors. For instance, the photodetector 104 may be coupled to and/or in communication with a tunable resistor 206. By way of another example, the tunable loading network 202 may include one or more tunable voltage sources (e.g., a ladder power supply, or the like). For instance, a tunable voltage source 208 may be coupled to and/or in communication with the tunable resistor 206.

It is noted herein that the one or more tunable electrical components (e.g., tunable capacitors, tunable resistors, tunable voltage sources, or the like) within the tunable loading network 202 may be considered tunable network electrical components (e.g., tunable network capacitors, tunable network resistors, tunable network voltage sources, or the like), for purposes of the present disclosure. In addition, it is noted herein the tunable loading network 202 is not limited to the exemplary arrangement of tunable electrical components as illustrated in FIGS. 2A and 2B. Therefore, the above description should not be interpreted as a limitation on the present disclosure but merely an illustration.

Although the present disclosure is directed to the front-end circuit 102 including one or more tunable capacitors to increase the range of duty-cycle tuning for a particular optical pulse frequency, it is noted herein the one or more tunable capacitors may be optional. In addition, although the present disclosure is directed to the front-end circuit 102 including one or more tunable capacitors to increase the range of duty-cycle tuning for a particular optical pulse frequency, it is noted herein the one or more tunable capacitors may instead be one or more fixed-value capacitors. In this regard, the one or more capacitors may be omitted from the front-end circuit 102, limiting possible duty-cycle tuning range in order to save operating area. Therefore, the above description should not be interpreted as a limitation on the present disclosure but merely an illustration.

It is noted herein the one or more tunable electrical components within the front-end circuit 102 (e.g., the one or more tunable capacitors, the one or more tunable resistors, the one or more tunable voltage sources, or the like) may be adjustable. For example, the one or more tunable electrical components may be adjustable via one or more analog controls. For instance, the one or more tunable electrical components may include one or more analog switches, buttons, knobs, or the like. By way of another example, the one or more tunable electrical components may be adjustable via one or more digital controls. For instance, the one or more tunable electrical components may include one or more digital switches, buttons, knobs, or the like. In addition, the one or more tunable electrical components may be programmable via a controller. The one or more tunable components may be coupled to and/or in communication with a common controller configured to program the one or more tunable components. The one or more tunable components may be coupled to and/or in communication with one or more separate or standalone controllers configured to program a subset of the one or more tunable components.

It is noted herein a controller may be a device including one or more of a processor, memory, a communication interface, or the like, for purposes of the present disclosure. In addition, it is noted herein a controller may be a device coupled to and/or in communication with one or more of a user interface (e.g., a device including one or more displays and/or one or more user input devices including one or more analog controls and/or one or more digital controls), a server, or the like, for purposes of the present disclosure.

The front-end circuit 102 may include one or more amplifiers. The one or more amplifiers may include any amplifier known in the art configured to compare a stream of input voltage signals with a stream of signals with a select voltage. For the one or more amplifiers may include, but are not limited to, a single component (e.g., a differential amplifier, an operational amplifier, or the like) or multiple components forming a general amplifier.

The one or more amplifiers may be configured to output a stream of voltage signals based on a comparison between a received input voltage signal and a second stream of signals with a select voltage. It is noted herein that sign of an output voltage signal is dependent on a particular output channel of a particular amplifier. For example, a particular output channel of a particular amplifier may output a positive voltage signal. By way of another example, a particular output channel of a particular amplifier may output a negative voltage signal.

A particular amplifier of the one or more amplifiers may be configured to receive a stream of input voltage signals from the tunable loading network 202. As illustrated in FIG. 2A, the front-end circuit 102 may include a single-stage amplifier 210. The tunable loading network 202 may be coupled to and/or in communication with the amplifier 210. For example, the stream of voltage signals generated by the tunable loading network 202 based on the stream of current pulses from the photodetector 104 may be input into the amplifier 210 via an input channel 212 of the amplifier 210. A tunable voltage source 214 may be coupled to and/or in communication with an amplifier 210 via an input channel 216 of the amplifier 210. For example, the amplifier 210 may generate a stream of output voltage signals 218 based on a comparison between the stream of input voltage signals from the tunable loading network 202 and a stream of select voltage signals from the tunable voltage source 214. The amplifier 210 may be coupled to and/or in communication with the signal processor 108. For example, the amplifier 210 may output the stream of output voltage signals 218 to the signal processor 108 via an output channel 220 of the amplifier 210.

A particular amplifier of the one or more amplifiers may be configured to receive a stream of input voltage signals from an additional amplifier positioned prior to the particular amplifier within the front-end circuit 102. As illustrated in FIG. 2B, the front-end circuit 102 may include a multi-stage amplifier arrangement. The amplifier 210 may be coupled to and/or in communication with an additional amplifier 222. For example, the stream of output voltage signals 218 generated by the amplifier 210 may be input into the additional amplifier 222 via an input channel 224. A tunable voltage source 226 may be coupled to and/or in communication with the additional amplifier 222 via an input channel 228 of the amplifier 222. For example, the additional amplifier 222 may generate a stream of output voltage signals 230 based on a comparison between the stream of output voltage signals 218 and a stream of select voltage signals from the tunable voltage source 226. The additional amplifier 222 may be coupled to and/or in communication with the signal processor 108. For example, the additional amplifier 222 may output the stream of output voltage signals 230 to the signal processor 108 via an output channel 232 of the additional amplifier 222.

It is noted herein the select duty-cycle phase of a converted or output stream of voltage signals for a particular optical pulse frequency may be dependent based on at least one of one or more operational parameters of the one or more tunable electrical components (e.g., a select capacitance of a tunable capacitor, a select resistance of a tunable resistor, a select voltage of a tunable voltage source, or the like) within the tunable loading network 202 and/or one or more operational parameters of one or more tunable voltage sources (e.g., select voltages of the one or more tunable voltage sources) coupled to one or more amplifiers. For example, at least one of a first set of operational parameters for a particular set of tunable electrical components within the tunable loading network 202 and/or the one or more operational parameters of the one or more tunable voltages coupled to one or more amplifiers may allow for a conversion of a stream of voltage signals to achieve a duty-cycle phase of 50 percent. By way of another example, at least one of a second, separate set of operational parameters for a particular set of tunable electrical components within the tunable loading network 202 and/or one or more operational parameters of the one or more tunable voltages of the one or more tunable voltage sources coupled to one or more amplifiers may allow for a conversion of the same stream of voltage signals to achieve a duty-cycle phase of 50 percent. In this regard, there more than one setting (or set of operational parameters) may achieve the same desired results (e.g., a duty-cycle phase of 50 percent).

It is noted herein that the front-end circuit 102 may include up to an N number of amplifiers in series to achieve a select duty-cycle resolution via up to an N number of conversion stages, where the select duty-cycle resolution is dependent on the number of steps within the N number of conversion stages defined by up to an N number of tunable voltage sources coupled to the N number of amplifiers. A first amplifier may set the select duty-cycle resolution with an initial number of steps for a particular optical pulse frequency. Subsequent amplifiers in series may increase the select duty-cycle resolution by increasing the number of steps for the particular optical pulse frequency. In this regard, the additional amplifiers may increase the number of steps within a range to increase the select duty-cycle resolution.

Where the front-end circuit 102 includes multiple conversion stages, the front-end circuit 102 may include identical conversion stages (e.g., conversion stages with the same number of steps and the same duty-cycle tuning range). It is noted herein, however, that the front-end circuit 102 may include conversion stages with different numbers of steps and/or different duty-cycle tuning ranges. For example, in the two-stage conversion (e.g., as illustrated in FIG. 2B) the conversion stage represented by the amplifier 210 may be a coarse-tuning stage with a duty-cycle tuning range of 80 percent with four steps (e.g., each step being 20 percent), while the conversion stage represented by the amplifier 222 may be a fine-tuning stage with a duty-cycle tuning range of 20 percent with four steps (e.g., each step being 5 percent) for the front-end circuit 102. In this example, a combination of the two amplifiers 210, 222 may provide a duty-cycle tuning range of 80 percent with sixteen total steps, each step being 5 percent. Therefore, the above description should not be interpreted as a limitation on the present disclosure but merely an illustration.

It is noted herein the achieving the select duty-cycle resolution is dependent on the configuration of the one or more tunable components within the front-end circuit 102 (e.g., the one or more tunable capacitors, the one or more tunable resistors, the one or more tunable voltage sources, or the like). However, the front-end circuit 102 may witness a trade-off between duty-cycle resolution and power consumption as the number of amplifiers in series increases.

Although exemplary embodiments of the present disclosure are directed to the front-end circuit 102 including one or more tunable components, it is noted herein that any of the one or more tunable components may instead be one or more fixed-value components (e.g., are not adjustable based on intended use for a particular application). Therefore, the above description should not be interpreted as a limitation on the present disclosure but merely an illustration.

Referring again to FIG. 1, the converter 100 may include the signal processor 108 coupled to and/or in communication with the front-end circuit 102. The signal processor 108 may include one or more electrical circuits, process blocks, and/or program instructions configured to process (e.g., receive, analyze, modify, output, or the like) the stream of voltage signals generated by the front-end circuit 102. It is noted herein that the front-end circuit 102 (e.g., the amplifier 210, the amplifier 222, or the like) may be directly coupled to the signal processor 108. In addition, it is noted herein that one or more additional front-end circuit electrical components may be positioned within the front-end circuit 102 and inline between the signal processor 108 and the amplifier 210 and/or the additional amplifier 222. Further, it is noted herein one or more converter 100 electrical components may be positioned outside the front-end circuit 102 and inline between the front-end circuit 102 and the signal processor 108.

Although the present disclosure is directed to a signal processor 108 coupled to and/or in communication with the front-end circuit 102, it is noted herein the converter 100 may include one or more components for displaying, digitization, or recording operations instead of or in addition to the signal processor 108. Therefore, the above description should not be interpreted as a limitation on the present disclosure but merely an illustration.

It is noted the converter 100 may be configured to operate in (e.g., coupled to and/or in communication with) any type of environment including, but not limited to, a fixed or mobile environment, an indoor or outdoor environment, and/or a commercial or industrial environment or in either a home or a business.

As will be appreciated from the above embodiments, the inventive concepts disclosed herein are directed to an optical pulse to voltage signal converter with a wide operating range of input pulse repetition rate and a wide duty-cycle tuning range, with the capability to achieve a select duty-cycle resolution.

It is to be understood that embodiments of the methods in accordance with the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed:

1. An optical pulse to voltage signal converter, comprising:
   a photodetector configured to generate a stream of current pulses by converting a stream of optical pulses received from a pulsed optical source;
   a front-end circuit, comprising:
      a tunable loading network configured to convert a stream of current pulses into a stream of input voltage signals;
      at least one tunable voltage source configured to generate at least one stream of signals with at least one select voltage; and
      at least one amplifier coupled to the at least one tunable voltage source, the at least one amplifier configured to compare the stream of input voltage signals and the at least one stream of signals with the at least one select voltage to generate at least one stream of output voltage signals with a select duty-cycle phase and a select duty-cycle resolution,
      the select duty-cycle phase being dependent on a set of operational parameters of the tunable loading network and the at least one tunable voltage source,
      the select duty-cycle resolution being dependent on a number of steps within at least one conversion stage defined by the at least one tunable voltage source; and
   a signal processor, the at least one amplifier further configured to output the at least one stream of output voltage signals to the signal processor.

2. The optical pulse to voltage signal converter of claim 1, the tunable loading network comprising a tunable network resistor and a tunable network voltage source, the set of operational parameters comprising a select resistance of the tunable network resistor and a select voltage of the tunable network voltage source.

3. The optical pulse to voltage signal converter of claim 2, the tunable loading network further comprising a tunable network capacitor, the set of operational parameters further comprising a select capacitance of the tunable network capacitor.

4. The optical pulse to voltage signal converter of claim 3, one or more of the tunable network resistor, the tunable network voltage source, the tunable network capacitor, or the at least one tunable voltage source being adjustable via one or more digital controls.

5. The optical pulse to voltage signal converter of claim 3, one or more of the tunable network resistor, the tunable network voltage source, the tunable network capacitor, or the at least one tunable voltage source being adjustable via one or more analog controls.

6. The optical pulse to voltage signal converter of claim 1, wherein the photodetector is a photodiode.

7. A front-end circuit for an optical pulse to voltage signal converter, comprising:
   a tunable loading network configured to convert a stream of current pulses into a stream of input voltage signals;
   a tunable voltage source configured to generate a stream of signals with a select voltage; and
   an amplifier coupled to the tunable voltage source, the amplifier configured to compare the stream of input voltage signals and the stream of signals with the select voltage to generate a stream of output voltage signals with a select duty-cycle phase and a select duty-cycle resolution,
   the select duty-cycle phase being dependent on a set of operational parameters of the tunable loading network and the tunable voltage source,
   the select duty-cycle resolution being dependent on a number of steps within a conversion stage defined by the tunable voltage source.

8. The front-end circuit of claim 7, the tunable loading network comprising a tunable network resistor and a tunable network voltage source, the set of operational parameters comprising a select resistance of the tunable network resistor and a select voltage of the tunable network voltage source.

9. The front-end circuit of claim 8, the tunable loading network further comprising a tunable network capacitor, the set of operational parameters further comprising a select capacitance of the tunable network capacitor.

10. The front-end circuit of claim 9, one or more of the tunable network resistor, the tunable network voltage source, the tunable network capacitor, or the tunable voltage source being adjustable via one or more digital controls.

11. The front-end circuit of claim 9, one or more of the tunable network resistor, the tunable network voltage source, the tunable network capacitor, or the tunable voltage source being adjustable via one or more analog controls.

12. The front-end circuit of claim 7, the stream of current pulses being generated by a photodetector configured to convert a stream of optical pulses received from a pulsed optical source.

13. The front-end circuit of claim 7, the amplifier further configured to output the stream of output voltage signals to a signal processor.

14. A front-end circuit for an optical pulse to voltage signal converter, comprising:
   a tunable loading network configured to convert a stream of current pulses into a stream of input voltage signals;
   a first tunable voltage source configured to generate a first stream of signals with a first select voltage;
   a first amplifier coupled to the first tunable voltage source, the first amplifier configured to compare the stream of input voltage signals and the first stream of signals with the first select voltage to generate a first stream of output voltage signals;
   a second tunable voltage source configured to generate a second stream of signals with a second select voltage; and
   a second amplifier coupled to the second tunable voltage source, the second amplifier configured to compare the first stream of output voltage signals and the second stream of signals with the second select voltage to generate a second stream of output voltage signals with a select duty-cycle phase and a select duty-cycle resolution, the select duty-cycle phase being dependent on a set of operational parameters of the tunable loading network, the first tunable voltage source, and the second tunable voltage source, the select duty-cycle resolution being dependent on a first set of steps within a first conversion stage defined by the first tunable voltage source and a second set of steps within a second conversion stage defined by the second tunable voltage source.

15. The front-end circuit of claim 14, the tunable loading network comprising a tunable network resistor and a tunable network voltage source, the set of operational parameters comprising a select resistance of the tunable network resistor and a select voltage of the tunable network voltage source.

16. The front-end circuit of claim 15, the tunable loading network further comprising a tunable network capacitor, the set of operational parameters further comprising a select capacitance of the tunable network capacitor.

17. The front-end circuit of claim 16, one or more of the tunable network resistor, the tunable network voltage source, the tunable network capacitor, the first tunable voltage source, or the second tunable voltage source being adjustable via one or more digital controls.

18. The front-end circuit of claim 16, one or more of the tunable network resistor, the tunable network voltage source, the tunable network capacitor, the first tunable voltage source, or the second tunable voltage source being adjustable via one or more analog controls.

19. The front-end circuit of claim 14, the stream of current pulses being generated by a photodetector configured to convert a stream of optical pulses received from a pulsed optical source.

20. The front-end circuit of claim 14, the second amplifier further configured to output the second stream of output voltage signals to a signal processor.

* * * * *